US006487008B2

(12) United States Patent
Morito

(10) Patent No.: US 6,487,008 B2
(45) Date of Patent: Nov. 26, 2002

(54) LIGHT AMPLIFYING DEVICE

(75) Inventor: Ken Morito, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/976,037

(22) Filed: Oct. 15, 2001

(65) Prior Publication Data

US 2002/0122245 A1 Sep. 5, 2002

(30) Foreign Application Priority Data

Jan. 9, 2001 (JP) .......................................... 2001-001842

(51) Int. Cl.$^7$ ................................................. H01S 3/00
(52) U.S. Cl. .................................. 359/344; 359/341.42
(58) Field of Search ........................... 359/344, 341.42, 359/341.41, 337

(56) References Cited

U.S. PATENT DOCUMENTS 5,506,724 A * 4/1996 Shimizu et al. ............. 359/341
5,633,750 A * 5/1997 Nogiwa et al. ............. 359/341

FOREIGN PATENT DOCUMENTS

JP 5-232528 9/1993

OTHER PUBLICATIONS

Yamamoto et al, "Sea Trial of Submarine Optical Amplifier Repeater System Using Travelling–Wave Semiconductor Laser Amplifier" (1989), Electronic Letters, vol. 25, No. 19, pp. 1299–1300.*

Yoshino, Manabu et al.; "Improvement of Saturation Output Power in a Semiconductor Laser Amplifier through Pumping Light Injection"; *IEEE Photonics Technology Letters*; vol. 8, No. 1, Jan. 1996; pp. 58–59.

Inoue, Kyo et al.; "Gain Dynamics of a Saturated Semiconductor Laser Amplifier with 1.47–μm LD Pumping"; *IEEE Photonics Technology Letters*; vol. 8, No. 4; Apr. 1996; pp. 506–508.

* cited by examiner

*Primary Examiner*—Mark Hellner
(74) *Attorney, Agent, or Firm*—Armstrong, Westerman & Hattori, LLP

(57) ABSTRACT

A light amplifying device, which employs a SOA, has been disclosed, wherein, the gain of the SOA is adjusted by the injection of light into the semiconductor optical amplifier. The signal light and the CW control light are combined, entered into the SOA, and the control light is removed from the light output from the SOA by the filter, the amplified signal light is divided by the divider, and the power of one of the divided lights is detected. The control unit changes the power of the control light in accordance with the detected power. The gain is adjusted by changing the power of the control light. In this structure, the density of the carrier in the active layer is reduced by increasing the power of the control light in order to decrease the gain, but the saturation light output power of the SOA is increased because the carrier life is reduced.

11 Claims, 10 Drawing Sheets

Fig.8
SIGNAL LIGHT
WAVELENGTH: 1538nm
WITHOUT CONTROL LIGHT
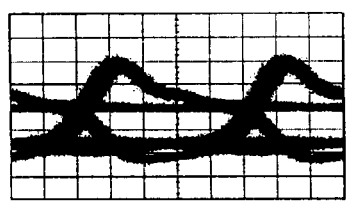
PO=+12.9dBm
WITH CONTROL LIGHT
(ILD=380mA)
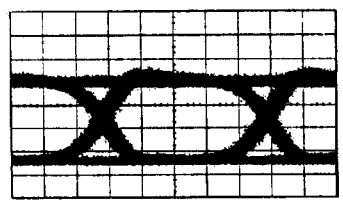
PO=+9.0dBm
SIGNAL LIGHT
WAVELENGTH: 1560nm
WITHOUT CONTROL LIGHT
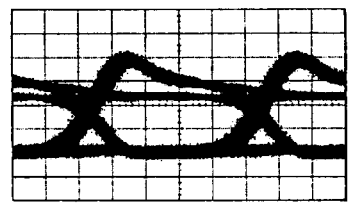
PO=+12.5dBm
WITH CONTROL LIGHT
(ILD=500mA)
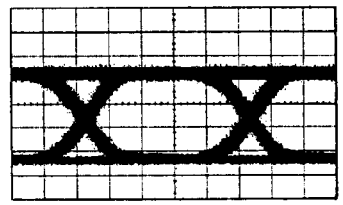
PO=+9.0dBm
AVERAGE POWER OF INPUT SIGNAL LIGHT

LIGHT AMPLIFYING DEVICE

BACKGROUND OF THE INVENTION

The present invention relates to a light amplifying device employing a semiconductor optical amplifier. More particularly, the present invention relates to a light amplifying device equipped with functions (ALC: Automatic Level Control, APC: Automatic Power Control), which control the level/power of output signal light to a constant value, and which can be used in a wavelength division multiplexed communication system.

Recently, development of a wavelength division multiplexed communication system, which will realize transmission through an optical fiber cable by multiplexing plural signal light of different wavelengths, has advanced to meet the increasing demands on communication systems. In a wavelength division multiplexed communication system, many optical components are used for light combination and light division, therefore, a light signal is attenuated by the losses of each optical component. To compensate for such losses, a light amplifying device is used.

Compared to the conventional optical fiber communication system, the wavelength division multiplexed communication system needs many more light amplifying devices, therefore, a light amplifying device must be compact and have low power consumption. Moreover, such a light amplifying device needs to have a large dynamic range to handle large variations in power level of the input signal light and functions (ALC/APC functions) to control the level/power of the output signal light to a constant value. Among various types of light amplifying devices, a semiconductor optical amplifier (SOA) is compact and has a low power consumption and, therefore, attracts interest as a light amplifying device to compensate for losses in the wavelength division multiplexed communication system.

To realize the ALC function in a light amplifying device employing a semiconductor optical amplifier, a method may be used in which electric current supplied to the semiconductor optical amplifier is changed to vary the gain of the semiconductor optical amplifier, but this method will bring about a problem in that the saturation level of the output light varies if the electric current supplied to the semiconductor optical amplifier is changed, and distortion of the signal occurs due to the pattern effect. Therefore, a structure is employed, in which the semiconductor optical amplifier is driven under a fixed condition almost near the upper limit so that the amplification factor is maintained constant, an attenuator to attenuate light input to the semiconductor optical amplifier is provided, and light is input to the semiconductor optical amplifier, after being attenuated by the attenuator, so as to have a constant power.

FIG. 1 is a diagram that shows the structure of an example conventional light amplifying device that employs a semiconductor optical amplifier and has an ALC function. As shown schematically, the output light of a modulator integrated DFB laser diode (MI-DFB-LD) 11 is modulated by the signal from a modulation signal source 12. The light output from the MI-DFB-LD 11 is amplified to a fixed power by a light amplifying device 21.

The optical amplifying device 21 comprises an attenuator (Att) 23, which attenuates the input light and the attenuation factor of which can be changed, a divider 24, which divides the output of the attenuator 23 in the ratio, for example, of 10:1, a power meter 25, which detects the power of the light of lower strength divided by the divider 24, a control unit 26, which controls the attenuation of the attenuator 23 according to the light detected by the power meter 25, and a semiconductor optical amplifier (SOA) 22, which amplifies the light of larger strength divided by the divider 24. The SOA 22 is driven under a fixed condition.

Next the ALC operation in the light amplifying device in FIG. 1 is described with reference to FIG. 2.

When modulated signal light is amplified in the SOA 22, it is necessary to set the average light output power of the SOA 22 lower than the saturated light output by a few dB in order to avoid signal distortion due to the pattern effect based on the gain saturation, in which the output light is saturated. Here, for example, it is set 5 dB lower than the saturated light output PS (dBm). Therefore, the permissible maximum value PSM (dBm) of the average light output power of the SOA 22 is shown as follows.

$$PSM(dBm) = PS(dBm) - 5dB \quad (1)$$

When the level of the output signal light of the light amplifying device is controlled to be constant by the ALC function, it is desirable that the target level is as large as possible, therefore, the target level is set to PSM (dBm).

As described above, the drive condition of the SOA 22 is fixed and, because the input light is amplified with a fixed gain Gs (dB), the permissible maximum value PSIM (dBm) of the average light input power to the SOA 22 is show as follows.

$$PSIM(dBm) = PSM(dBm) - Gs(dB) \quad (2)$$

Therefore, if the average light input power PSIM (dBm) to the SOA 22 is constantly adjusted so as to be PSIM (dBm) by the variable attenuator 23, the level of the output signal light of the SOA 22 is constantly a fixed PSM (dBm).

The lower limit PIMIN (dBm) of the average light input power to the light amplifying device 21, when no attenuation is carried out by the attenuator 23, is shown by the following expression, the basic loss LA1 of the attenuator 23 and the loss LD1 of the optical divider 24 being taken into account.

$$PIMIN(dBm) = PSIM(dBm) + LA1 + LD1 \quad (3)$$

The dynamic range ΔPIN (dB) of the light amplifying device 21 is determined by the maximum quantity of attenuation LATM (dB) of the attenuator 23.

$$\Delta PIN(dB) = LATM(dB) \quad (4)$$

Therefore, the upper limit PIMAX (dBm) of the average light input power of the light amplifying device 21 is determined by the following expression.

$$PIMAX(dBm) = PIMIN(dBm) + \Delta PIN(dB) = PSIM(dBm) + LA1 + LD1 + LATM(dB) \quad (5)$$

From the standpoint of generality, it is preferable that a light amplifying device can be used commonly for signal light of various wavelengths. For example, when combining plural types of signal light of different wavelengths transmitted from a transmitter, after each signal light is amplified to a fixed value, respectively, or when recombining plural types of signal light of different wavelengths received by a relay device, after each signal light is divided and amplified to a fixed value, individually, it is troublesome to use plural different light amplifying devices according to each wavelength, or to set different conditions even if a single light amplifying device is used.

The light amplifying device shown in FIG. 1 can provide light output of a fixed level as long as the wavelength of the signal light is fixed. Because the gain of the SOA 22 has wavelength dependence, however, levels of the output signal light of the light amplifying device vary depending on the wavelength of signal light, even though the average light input power to the SOA21 is controlled to be constant in the structure in FIG. 1. Therefore, in the structure in FIG. 1, if only the average light input power of the signal light is monitored and the wavelength of the signal light is not monitored, the average light output power does not remain constant, and the average light output power of the signal light varies depending on the wavelength by the difference ΔGs (dB) between the maximum gain GsH (dB) and the minimum gain GsL (dB) of the SOA 22 in the range of the used wavelength, as shown below.

$$\Delta Gs(\text{dB}) = GsH(\text{dB}) - GsL(\text{dB}) \quad (6)$$

In order to keep the average light output power constant even when the wavelength varies, a mechanism is needed, which detects the output of the SOA and attenuates the output of the SOA according to the detected value. FIG. 3 shows an example of a structure, in which mechanisms that detect the level of the signal light and attenuate according to the detected value are provided on both sides of the SOA in order to obtain a fixed average light output power regardless of the wavelength.

In the structure shown in FIG. 3, a selector 20, which selects a light signal to amplify from among plural light signals of different wavelengths, is provided and the light signal selected by the selector 20 is input into the light amplifying device 21. Therefore, only one light signal is input into the light amplifying device 21 at one time, but the input light signals have plural wavelengths.

In the light amplifying device 21, a similar attenuation mechanism is provided for the output of SOA 22, in addition to the structure in FIG. 1. As shown schematically, this attenuation mechanism comprises a second attenuator (Att) 27, which attenuates the output of the SOA 22 and the attenuation factor of which can be changed, a second divider 28, which divides the output of the second attenuator 27, a second power meter 29 that detects the power of the light divided by the second divider 28, and a second control unit 30 that controls the quantity of attenuation of the second attenuator 27 according to the light detected by the second power meter 29.

The ALC operation of the light amplifying device shown in FIG. 3 is described with reference to FIG. 4.

It is assumed that the saturated light output of the SOA 22 slightly depends on wavelength and the saturated light output is constant at PS in the assumed range of wavelengths. As described above, if the average light output power of the SOA 22 is lower than the saturated light output PS by 5 dB, the permissible maximum value PSM (dBm) of the average light power of the SOA 22 is shown by the above-mentioned expression (1).

The permissible maximum value PSM (dBm) of the average light power in the assumed range of wavelengths is obtained when the light of wavelength λH that gives the maximum gain GsH (dB) of the SOA 22 enters, and it is expressed as below.

$$PSIM(\text{dBm}) = PSM(\text{dBm}) - GsH(\text{dB}) \quad (7)$$

Therefore, on the input side of the SOA 22, the average light input power of the SOA 22 is adjusted to be PSIM (dBm) regardless of the wavelength, as described in FIGS. 1 and 2. In other words, the average light output power PSM1 (dBm) of the SOA 22 when the light of wavelength λH enters becomes PSM (dBm).

On the contrary, the average light output power of the SOA 22, when the light of wavelength λL that gives the minimum gain GsL (dB) of the SOA 22 in the assumed range of wavelengths is entered, becomes the minimum value PSM2 (dBm) and expressed as below.

$$PSM2(\text{dBm}) = PSIM(\text{dBm}) + GsL(\text{dB}) \quad (8)$$

Because it is preferable that the output of the light amplifying device 21 is as large as possible, when the average light output power of the SOA 22 is PSM2 (dBm), the quantity of attenuation of the second attenuator 27 is regarded as the basic loss LA2 of the second attenuator 27. Moreover, taking the loss LD2 of the second divider 28 into account, the minimum value of the average light output power of the light amplifying device, that is the output of the second divider 28, is obtained by subtracting LA2 and LD2 from PSM2 (dBm). Therefore, the target value POSET when controlling the output of the light amplifying device 21 is set to this value. That is, $$POSET(\text{dBm}) = PSM2(\text{dBm}) - LA2(\text{dB}) - LD2(\text{dB}) = PSIM(\text{dBm}) + GsL(\text{dB}) - LA2(\text{dB}) - LD2(\text{dB}) = PSM(\text{dBm}) - [(GSH(\text{dB}) - GsL(\text{dB})) + LA2(\text{dB}) + LD2(\text{dB})] \quad (9)$$

On the other hand, the lower limit PIMIN of the average light input power of the light amplifying device is, $$PIMIN\ (\text{dBm}) = PSIM(\text{dBm}) + LA1 + LD1,$$

as mentioned above, and the upper limit PIMAX is, $$PIMAX\ (\text{dBm}) = PIMIN\ (\text{dBm}) + \Delta PIN(\text{dB}) = PSIM(\text{dBm}) + LA1 + LD1 + LATM(\text{dB}),$$

as mentioned above.

When used in the wavelength division multiplexed communication system, it is necessary to use a light amplifying device having the ALC function as shown in FIG. 3, but two systems to control the light power are needed on both input and output sides and this leads to a larger scale of the device and, accordingly, a higher cost.

A problem in that the set value of the average light output power of the light amplifying device becomes smaller than the maximum average light output power of the SOA when the wavelength is fixed by [(GSH (dB)−GsL (dB))+LA2 (dB)+LD2 (dB)], as shown in the expression (9) is brought about.

SUMMARY OF THE INVENTION

The object of the present invention is to realize a light amplifying device which can be used in a wide range of wavelengths with a comparably simple structure and employs a SOA that can carry out the automatic control of the light output level at a high power level.

To realize the above-mentioned object, the gain of a semiconductor optical amplifier (SOA) is adjusted by the injection of light into the SOA in the present invention. FIG. 5 shows the basic structure of a light amplifying device 31 of the present invention. As shown schematically, in the light amplifying device of the present invention, the signal light input into a combiner 33 and the continuous wave (CW) output from a control light source 38 are combined and entered into a SOA 32. The control light is removed from the light emitted from the SOA 32 by a filter 34, the signal light after amplified in a divider 35 is divided, and the power of one of the divided light is detected by a power meter 36. A control unit 37 changes the power of the control light output from the control light source 38 according to the power detected by the power meter 36. By changing the power of the control light to be input into the SOA 32, and therefore, by changing the consumed amount of the carrier in the active layer due to the induced stimulated emission process in the SOA 32, the gain is adjusted. In this structure, the power of the control light is increased and the carrier in the active layer density is decreased to reduce the gain, but as disclosed in the document A (IEEE PHOTONICS TECHNOLOGY LETTERS, VOL. 8, NO 1, JANUARY 1996 (Improvement of Saturation Output Power in a Semiconductor Laser Amplifier through Pumping Light Injection) (Manabu Yoshino and Kyo Inoue), the carrier life is reduced due to the induced stimulated emission process, and the saturation light output power of the SOA 32 is increased. That is, it is possible to reduce gain while increasing the saturation light output power.

It is also possible to adjust the variations of the output light power due to the wavelength dependence of the SOA gain by adjusting the control light power, therefore, the average light output power of the SOA can be set to PSM1 (dBm) regardless of the wavelength. The value that is obtained by subtracting the basic loss of the filter 34, LF (dBm), and the loss of the divider 35, that is LD2 (dB), from PSM1 becomes the average light output power of the light amplifying 31, that is PO (dBm), and shown by the following expression, $$PO(dBm)=PSM1(dBm)-LF(dB)-LD2(dB)$$

The set value of the average light output power of the light amplifying device, that is POSET (dBm) is assumed to the above-mentioned PO (dBm), when the level of the output signal light of the light amplifying device 31 is controlled to a fixed value. Therefore, $$POSET(dBm)=PO(dBm)=PSM1(dBm)-LF(dB)-LD2(dB).$$

The output light level thus can be controlled to a fixed value at a power higher than that in the conventional structure in FIG. 3 by (GsH (dB)−GsL (dB)+LA2−LF).

As described above, the saturated light output is increased when the control light is injected into the SOA, therefore, it is possible to widen the input dynamic range upward because the permissible maximum light input power increases. It is also possible to apply to the wavelength division multiplex communication system while realizing a constant control of the output light level at a high power in a comparatively simple structure, because the variations of the output light power due to the wavelength dependence of the SOA gain can be controlled by adjusting the control light power.

BRIEF DESCRIPTION OF THE DRAWINGS

The present invention will be more clearly understood from the description as set below, with reference to the accompanying drawings, wherein:

FIG. 8 is a schematic diagram that shows the result of the second experiment.

DESCRIPTION OF THE PREFERRED EMBODIMENTS

Figure 6:
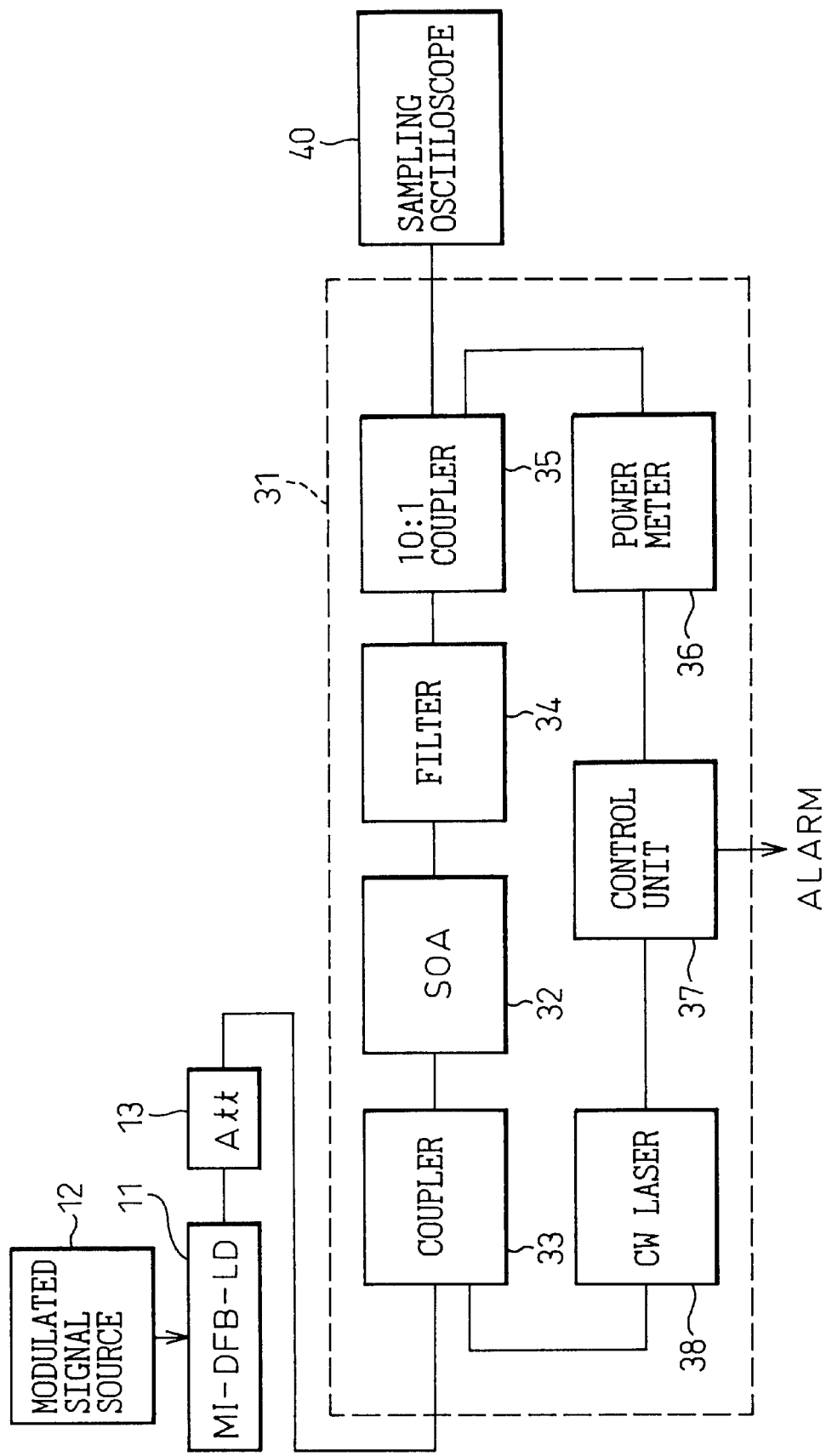
FIG. 6 is a schematic diagram that shows the structure of the experimental setup.

The first validation experiment of the light amplifying device 31 was conducted on the structure shown in FIG. 6. The results are described below.

As shown in FIG. 6, the modulator integrated DFB laser diode (MI-DFB-LD) 11 outputs the signal light of 1560 nm wavelength. The MI-DFB-LD 11 is modulated by the modulation signal source 12. The signal is modulated here under the condition of 10 Gb/s, NRZ (Non Return Zero), PRBS (Pseudo Random Binary Sequence)=$2^{31}-1$. The signal light from the MI-DFB-LD 11 is input into the light amplifying device 31 after being adjusted by a light attenuator (Att) 13, the attenuation quantity of which can be changed. After being amplified in the light amplifying device 31, the signal light is input into a sampling oscilloscope 40 for analysis.

Figure 1:
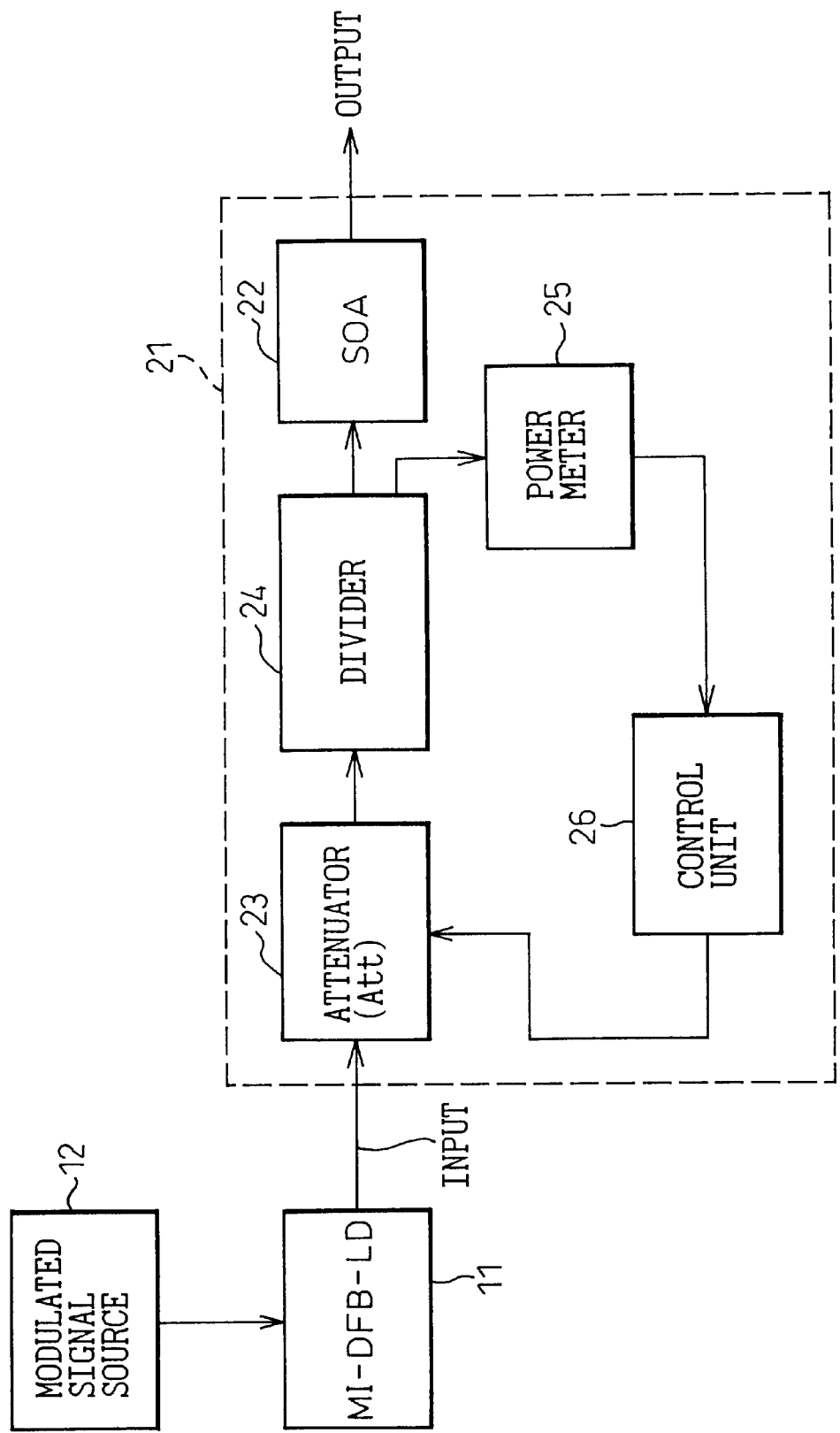
FIG. 1 is a schematic diagram that shows an example structure of the conventional light amplifying device having the ALC function (in the case of single wavelength.)
Figure 2:
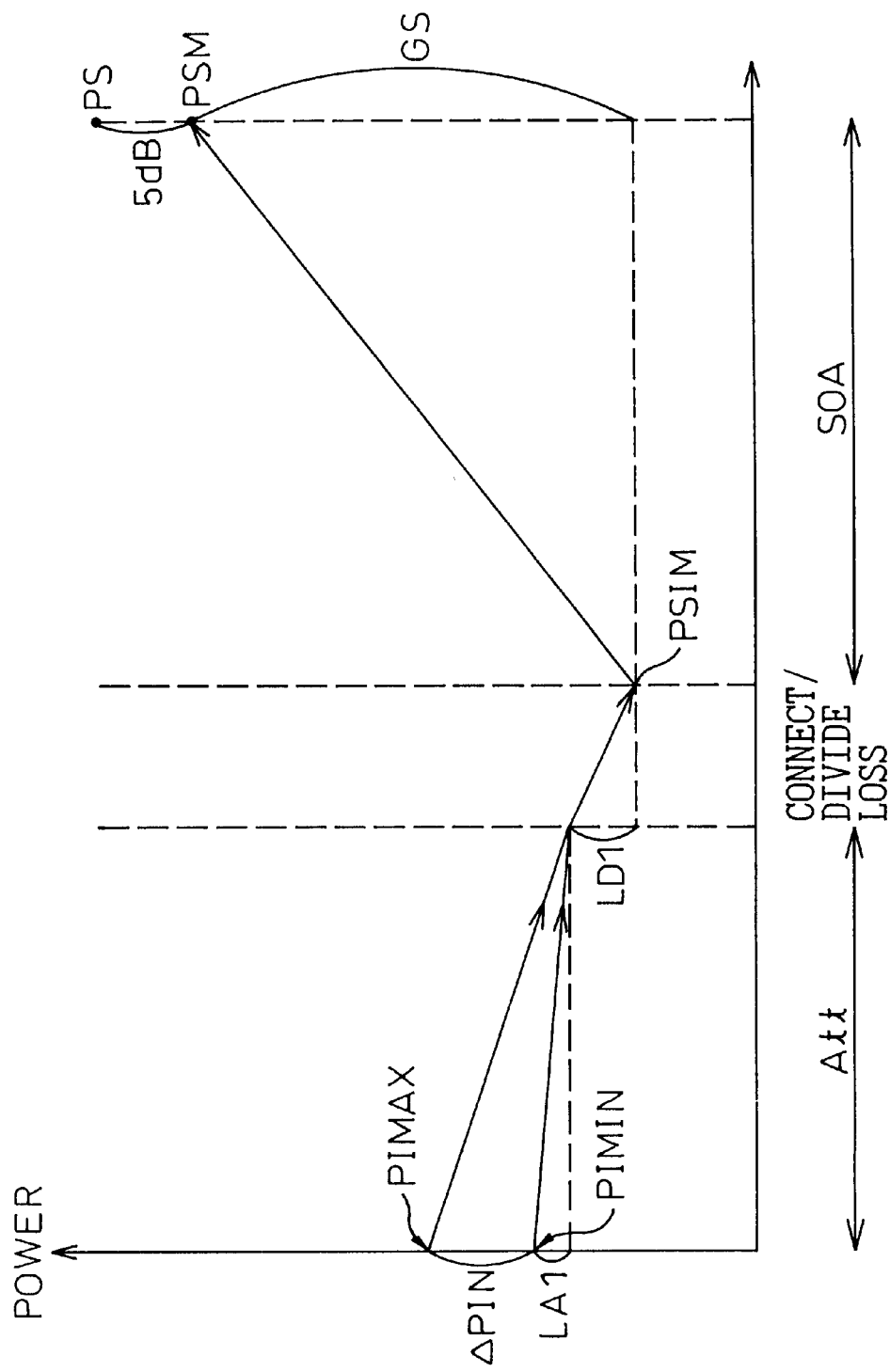
FIG. 2 is a schematic diagram that illustrates the ALC control in the structure in FIG. 1.
Figure 3:
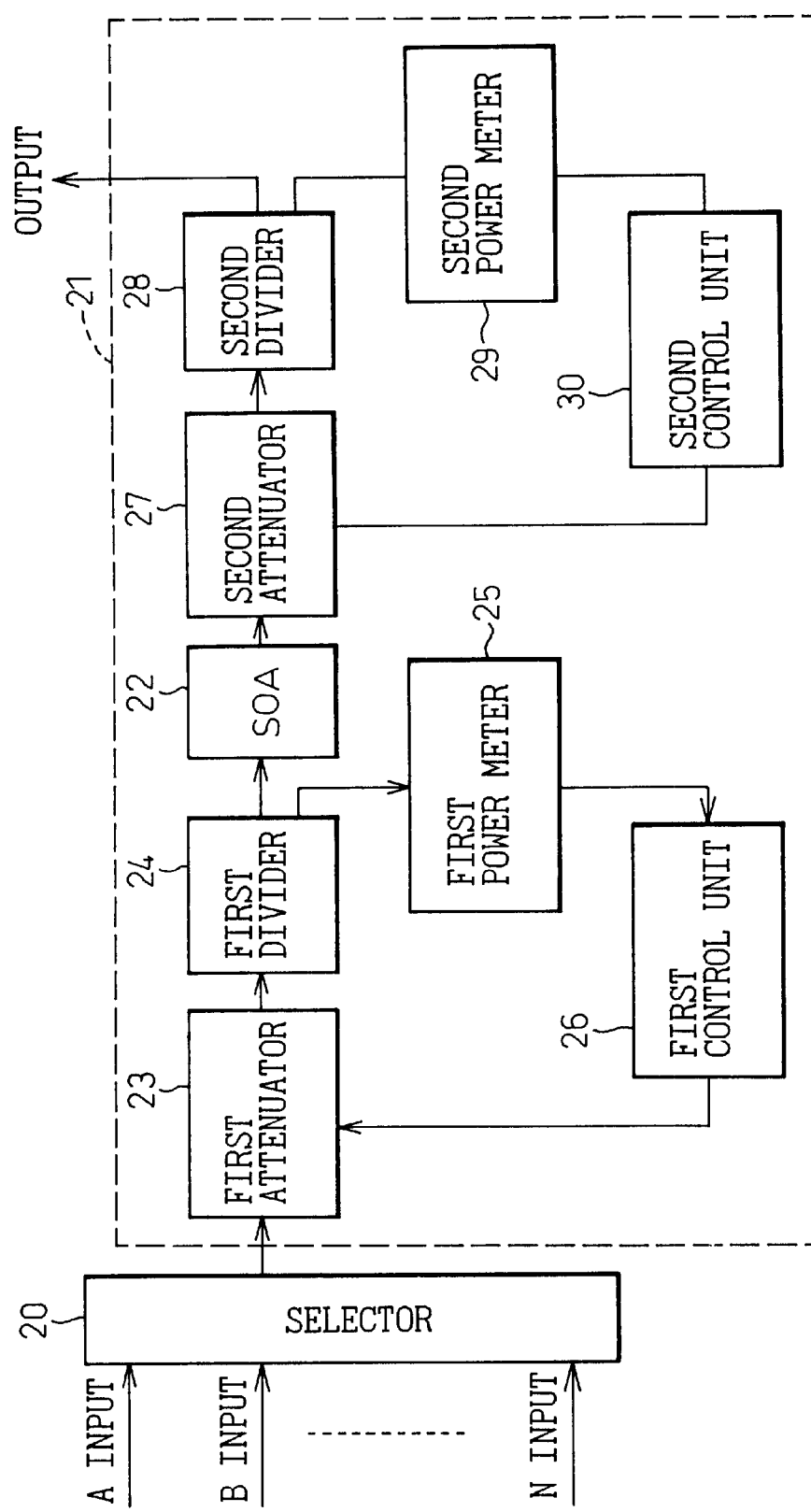
FIG. 3 is a schematic diagram that shows an example structure of the conventional light amplifying device having the ALC function (in the case in which a single wavelength is selected from among plural wavelengths.)
Figure 4:
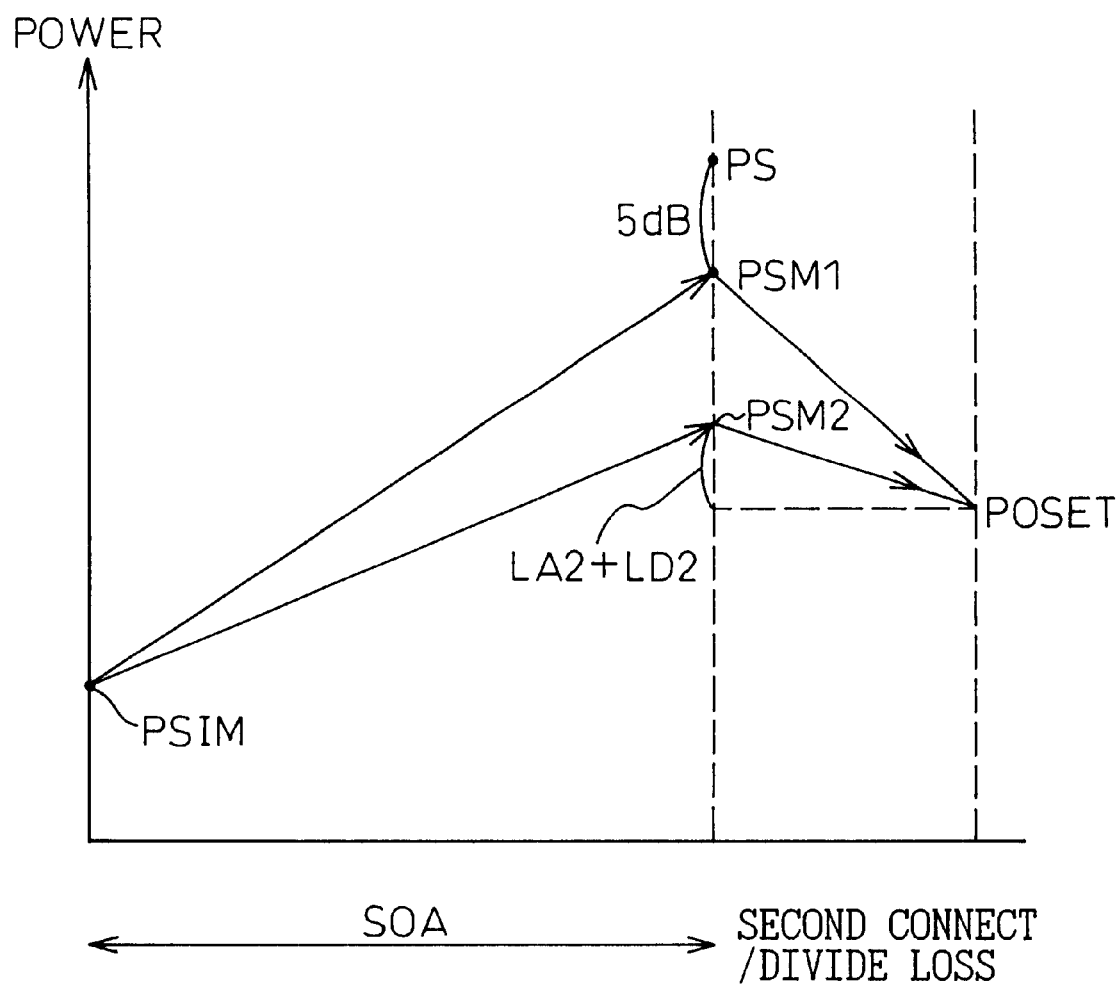
FIG. 4 is a schematic diagram that illustrates the ALC control in the structure in FIG. 3.
Figure 5:
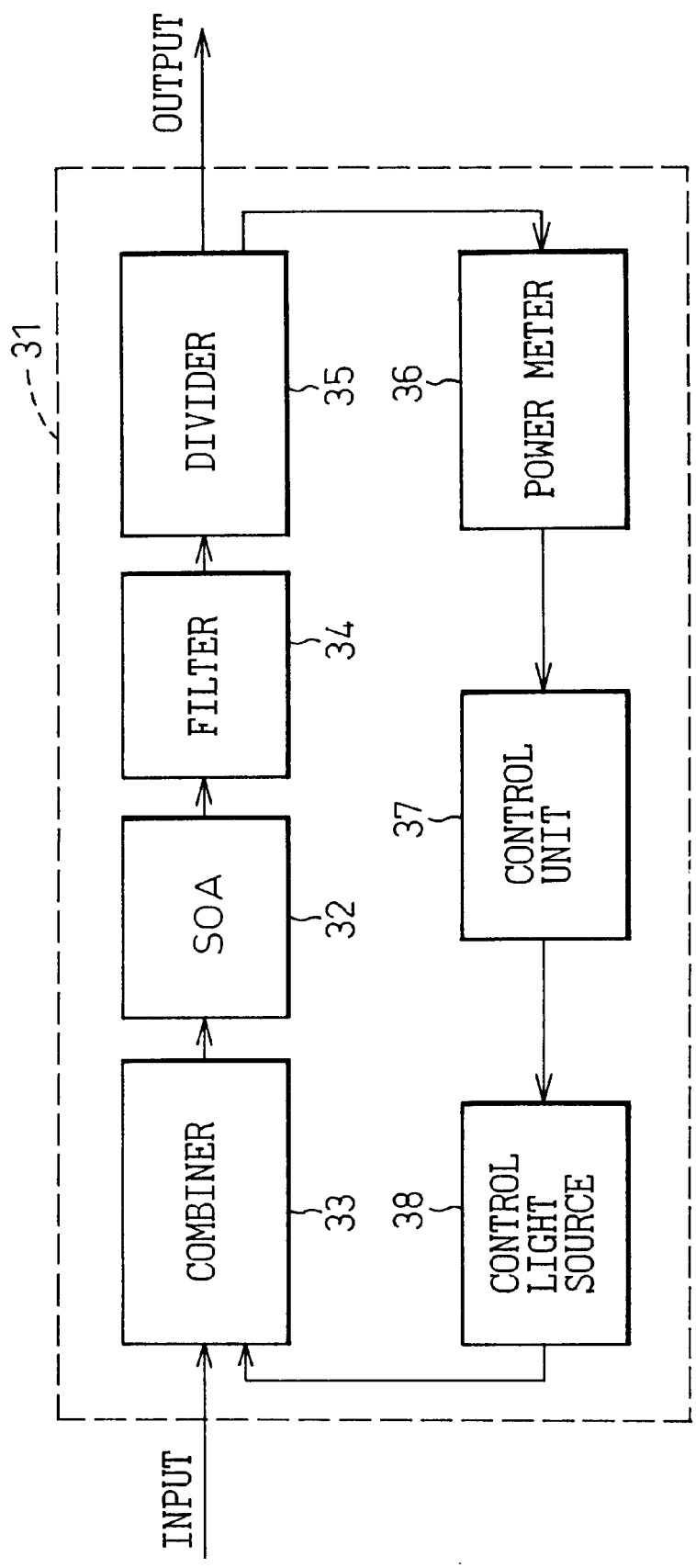
FIG. 5 is a schematic diagram that shows the basic structure of the light amplifying device of the present invention.

The light amplifying device 31 used in the experiment has the same structure as that shown in FIG. 5. That is, the light amplifying device 31 comprises a CW laser 38 corresponding to the control light source, a coupler 33 corresponding to the combiner, the SOA 32, the filter 34, a 10:1 coupler 35 corresponding to the divider, the power meter 36, and the control unit 37.

The SOA 32 is of polarization independent type, as disclosed in Japanese Patent Application No. 12-158399 (U.S. patent application Ser. No. 09/585,323). The drive current of the SOA is set to 250 mA, the saturated light output at this time for the CW (Continuation Wave) light of 1560 nm wavelength is +12.5 dBm, and the fiber-to-fiber gain is 19 dB. The CW laser 38 is a CW laser of a single mode oscillation type and the wavelength of the output control light is 1520 nm. The wavelength 1520 nm almost coincides with the gain peak wavelength when the SOA is driven with a current of 250 mA. The coupler 33 is of wavelength divided multiplex (WDM) type and the loss is 3 dB. The filter 34 is of a band-pass type and blocks the control light. The 10:1 coupler 35 is a fiber coupler that divides the signal light output through the filter 34 in the ratio of 10/1. The sampling oscilloscope 40 is an OE module built-in digital communication analyzer.

Next, the ALC operation of the device in FIG. 6 is described. First, the input level of the signal light into the light amplifying device 31 is changed by the light attenuator (Att) 13. The output level of the signal light that changes accordingly is monitored by the light power meter 36. The control unit 37 reduces the power of the control light when the output level of the signal light is lower than the target value of +6.2 dBm, and increases the power of the control light when the output level of signal light is higher than the target value of +6.2 dBm to match the output level of the signal light to the target value of +6.2 dBm. The control unit 37 issues an alarm signal notifying power shortage when the output level of the signal light does not increase to the target value even if the power of the control light is decreased to its lower limit, and issues an alarm signal notifying power excess when the output level of the signal light does not decrease to the target value even if the power of the control light is increased to its upper limit.

Figure 7:
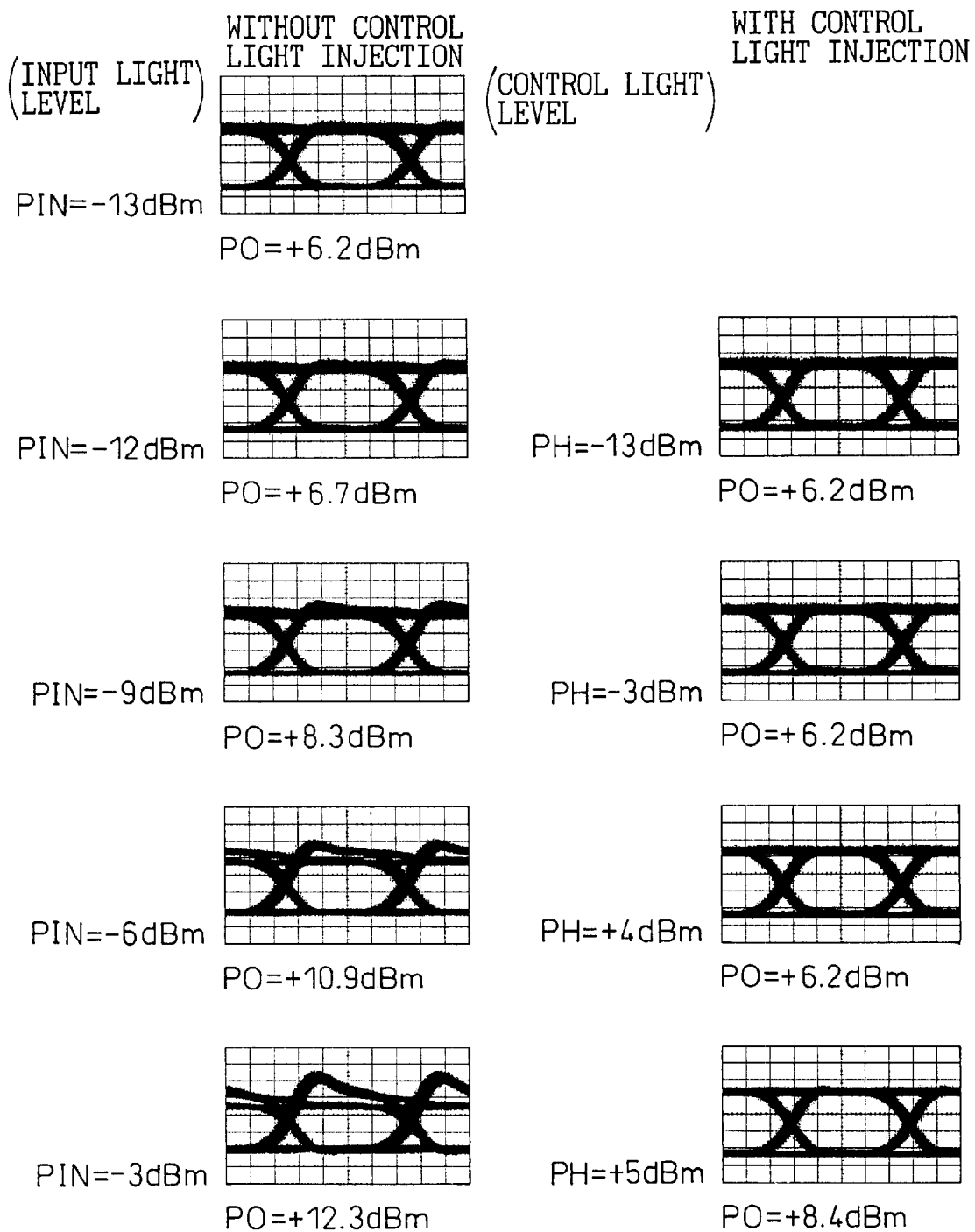
FIG. 7 is a schematic diagram that shows the result of the first experiment.

FIG. 7 is a schematic diagram that shows the measurement result of the first experiment conducted under the above-mentioned conditions. The eye-patterns of the output light and its average light output power PO when the input light level PIN is set to −13 dBm, −12 dBm, −9 dBm, −6 dBm, and −3dBm, respectively, are shown, and the left-hand side indicates when the control light is not injected, and the right-hand side indicates when the control light of level PH is injected.

As is obvious from FIG. 7, if the control light is not injected, the degradation of the waveforms caused by the pattern effect can be observed as the level of the signal light entering the SOA increases. It can be seen that the degradation of the waveforms caused by the pattern effect can be suppressed for the signal light of a high level entered into the SOA by the injection of the control light. When the control light is injected, the upper limit of the input level of the signal light is −3 dBm, and this means the upper limit can be raised by 10 dB compared to −13 dBm, when the control light is not injected. Moreover, even if the input level of the signal light is raised by 7 dB from −13 dBm to −6 dBm, the output level of the signal light can be controlled to a fixed value of +6.2 dBm by adjusting the power of the control light to increase.

In the present experiment, the light source of the control light provides the upper limit of +5 dBm of the control light entered into the SOA but, by supplying control light of a higher power, the output level of the signal light, the input level of which is higher, can be controlled to a fixed value.

In the first experiment, the wavelength of the signal light is fixed to 1560 nm, but the control of the output light level for the signal light of different wavelengths has been confirmed in the second validation experiment.

The structure of the second experiment is the same as that shown in FIG. 6, and the two MI-DFB-LDs 11, of 1538 nm and 1560 nm wavelengths, are used, respectively, in the experiment. The SOA is of a polarization independent type and the drive current is 250 mA. The saturation light output of the SOA for the CW light of 1538 nm wavelength is 12.0 dBm, the fiber-to-fiber gain is 22 dB, and the saturation light output power for the CW light of 1560 nm wavelength is 12.5 dBm and the fiber-to-fiber gain is 19 dB. The CW laser 38 is a pump laser used to excite EDFA, and puts out a control light of 1480 nm wavelength. Other portions are the same as in the first experiment.

The input level of the signal light entering the light amplifying device 31 is adjusted to −2 dBm by the light attenuator 13. The output level of the signal light is monitored by the power meter 36 and when the output level of the signal light is smaller than the target value of +9 dBm, the power of the control light is decreased, and when the output level of the signal light is larger than the target value of +9 dBm, the power of the control light is increased, so that the output level of the signal light is controlled to match the target value of +9 dBm.

FIG. 8 shows the measurement results of the second experiment, and the eye-pattern of the output light and its average light output power PO when the control light exists and not, for the wavelengths 1538 nm and 1560 nm of the signal light, are shown. ILD indicates the drive current of the CW laser 38.

As shown in FIG. 8, when the input level of the signal light is −2 dBm, a drastic degradation of waveforms caused by the pattern effect can be observed if the control light is not injected, but if the control light is injected, the degradation of waveforms caused by the pattern effect can be suppressed. The permissible upper limit of the input level of the signal light for the signal light of 1538 nm wavelength, when the control signal is not used, is −16 dBm (not shown), but when the control light is used, the degradation of waveforms does not occur at −2 dBm, resulting in the increase of 14 dB. Similarly, for the signal light of 1560 nm wavelength, the permissible upper limit of the input level of the signal light when the control light is not used is −13 dBm (not shown), but when the control light is used, the degradation of waveforms does not occur at −2 dBm, resulting in the increase of 11 dB. When the input level of the signal light is −2 dBm, the output level of the signal light can be controlled to a fixed value of +9 dBm, by changing the drive current of the CW laser 38, which is the light source of the control light, for the signal light of 1538 nm and 1560 nm wavelengths, respectively, to adjust the power of the control light.

Next, the inventors conducted the third validation experiment of the level control of the output light of different wavelengths, using a SOA of polarization independent type having large saturated light output with a thin tensile-strained bulk active layer, which has been disclosed in the above-mentioned Japanese Patent H12-158399 (application date: May 29, 2000). The structure of the third experiment is the same as that in FIG. 6, and all the conditions except for the SOA are the same as those in the second experiment.

The SOA used in the third experiment is of a polarization independent type having the thin tensile-strained bulk active layer, as mentioned above, and the thickness of the active layer is 50 nm, the width is 1.4 $\mu$m, and the length is 1200 $\mu$m. The drive current is set to 500 mA, the saturation light output power for the CW light of 1538 nm wavelength is +16.7 dBm, the fiber-to-fiber gain is 21 dB, the saturation light output power for the CW light of 1560 nm wavelength is +17.5 dBm, and the fiber-to-fiber gain is 18 dB.

The input level of the signal light entered into the light amplifying device 31 is changed by the light attenuator 13, and monitors the output level of the signal light that changes in accordance with the input level by the light power meter. When the output level of the signal light is smaller than the target value of +10 dBm, the power of the control light is decreased, and when the output level of the signal light is larger than the target value of +10 dBm, the power of the control light is increased so that the output level of the signal light is controlled to match the target value of +10 dBm.

Figure 9:
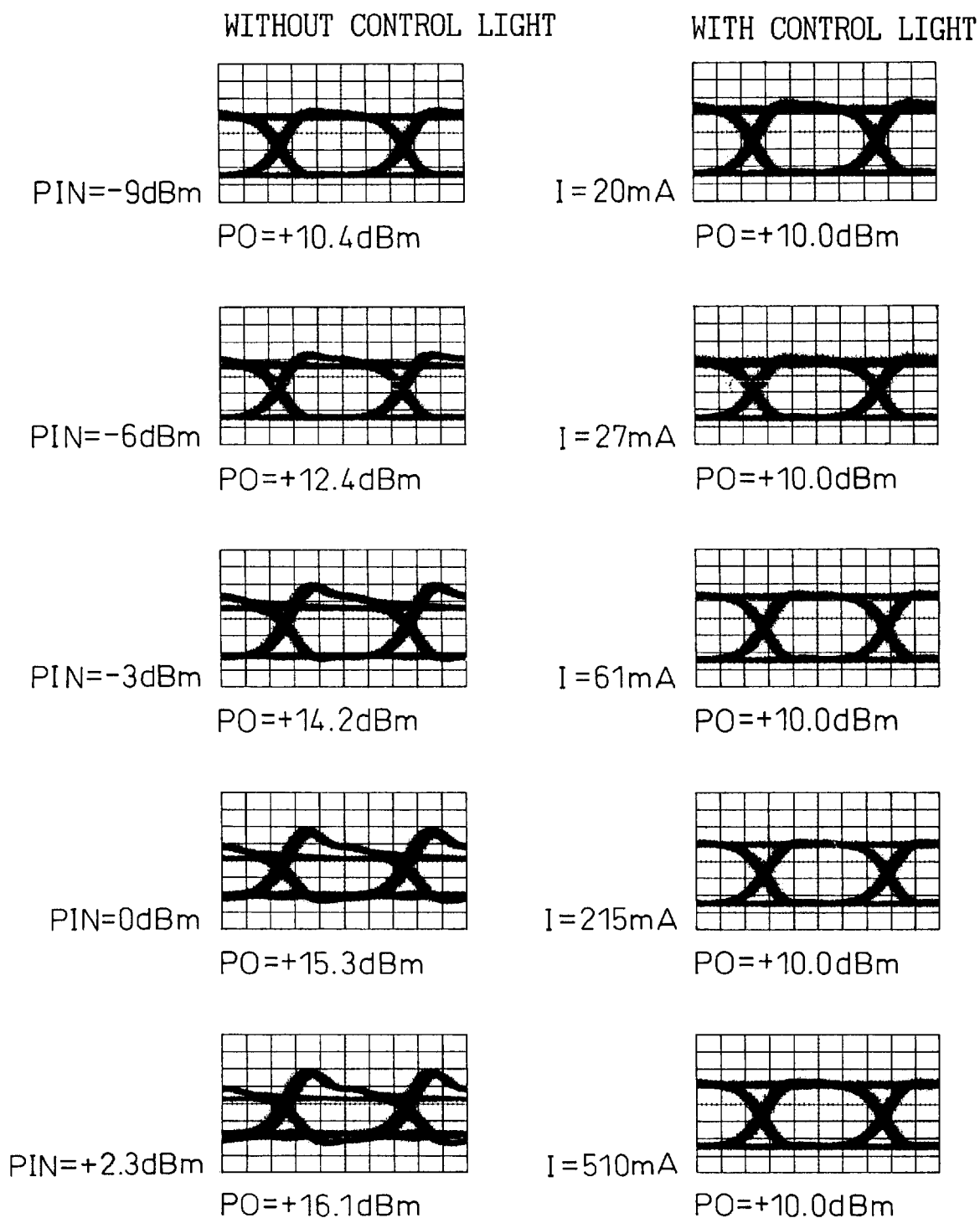
FIG. 9 is a schematic diagram that shows the result of the third experiment.
Figure 10:
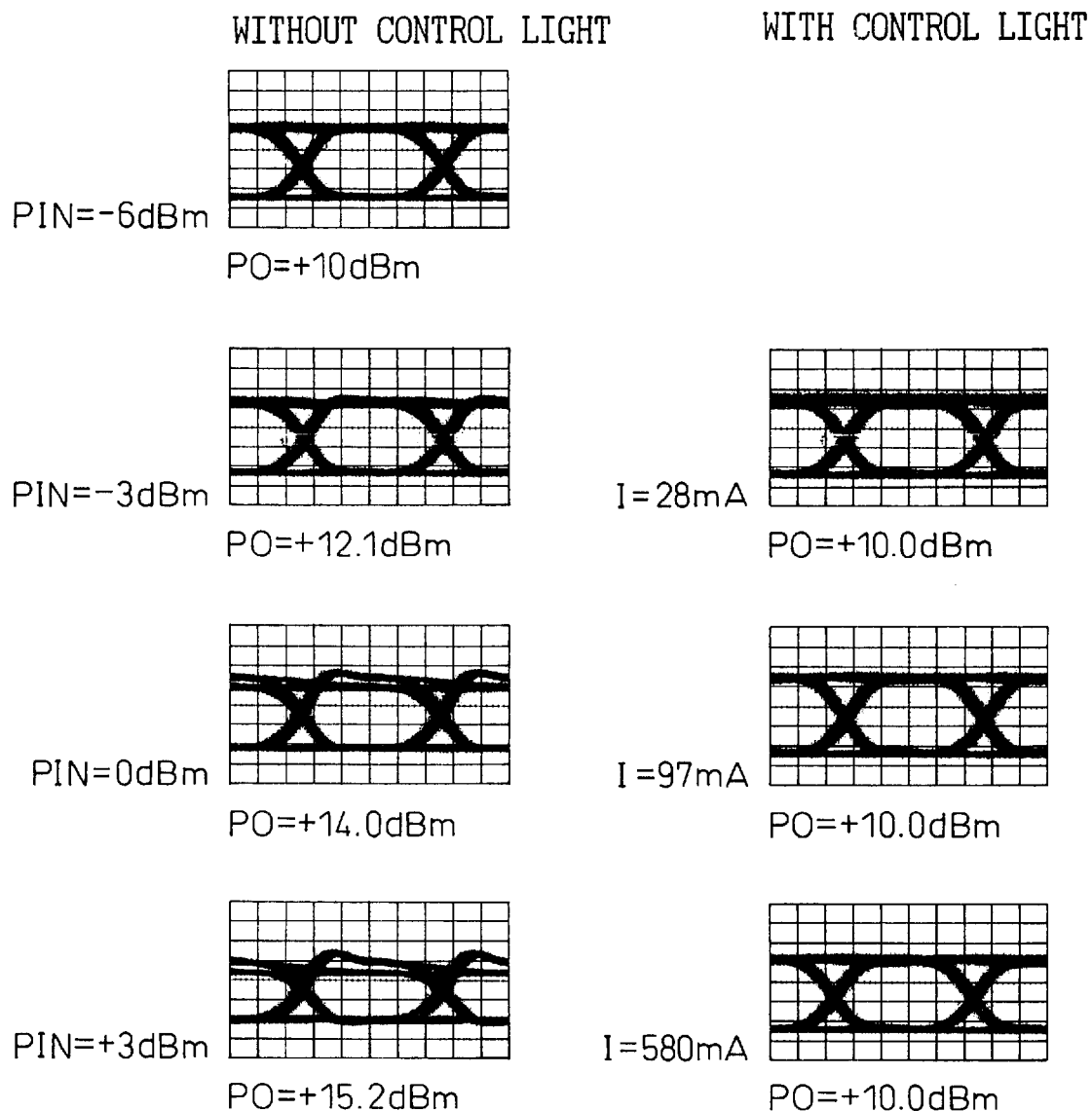
FIG. 10 is a schematic diagram that shows the result of the third experiment.

FIGS. 9 and 10 show the measurement results of the third experiment, conducted under the above-mentioned conditions, wherein FIG. 9 shows the result for the signal light of 1538 nm wavelength, FIG. 10 shows the result of the signal light of 1560 nm wavelength, and this experiment is the same as that in FIG. 7 except the level of the control light which is indicated by the drive current of the CW laser.

As is obvious from FIGS. 9 and 10, if the control light is not injected, the degradation of waveforms caused by the pattern effect can be observed as the level of the signal light entering the SOA increases. When the control light is injected, the degradation of waveforms caused by the pattern effect can be suppressed by increasing the power of the control light as the input level of the signal light increases.

The upper limit of the input level of the signal light for the signal light of 1538 nm wavelength, when the control light is injected, is +2.3 dBm, that is, larger than −9 dBm by 11.3 dB when the control light is not injected. The upper limit of the input level of the signal light for the signal light of 1560 nm wavelength, when the control signal is not injected, is +3.0 dBm, that is, the upper limit becomes larger than −6 dBm by 9 dB when the control signal is not injected.

In conclusion, for the results mentioned above, the output level of the signal light can be controlled to the fixed value of +10 dBm in the range of −6 dBm to +2.3 dBm of the output level of the signal light, for the signal light of 1538 nm and 1560 nm wavelengths.

As described above, according to the present invention, the gain is adjusted in a manner in which the control light enters into the SOA from the signal light and the consumed quantity of the carrier in the active layer due to the induced stimulated emission is changed by changing the power of the control light and, when the gain is reduced by increasing the power of the control light to decrease the density of the carrier in the active layer, the saturated light output of the SOA increases instead, because the carrier life time is reduced due to the induced stimulated emission. In other words, it is possible to reduce the gain while increasing the saturation light output power.

As a result, it is possible to control the output light power while extending the input dynamic range upward (direction of an increase) by raising the permissible maximum light input power. Moreover, the variations of the output light power caused by the wavelength dependence of the SOA gain can also be controlled by the adjustment of the control light power, therefore, the application to the wavelength division multiplexed communication system is facilitated.

We claim:

1. A light amplifying device comprising a control light source that outputs control light and the power of said control light output in accordance with a control signal can be changed, a combiner that combines signal light and said control light, a semiconductor optical amplifier that amplifies the light put out by said combiner, a monitor that detects the power of said signal light among light put out by said semiconductor optical amplifier, and a control unit that generates said control signal in accordance with the value detected by said monitor.

2. A light amplifying device, as set forth in claim 1, wherein the wavelength of said control light is different from the wavelength of said signal light.

3. A light amplifying device, as set forth in claim 2, wherein a wavelength separator that separates said signal light and said control light among the light output by said semiconductor optical amplifier is further provided.

4. A light amplifying device, as set forth in claim 1, wherein said monitor comprises a divider that divides part of said amplified signal light, outputs part of it as monitor light, and outputs the rest of it as output light, and a light power meter that detects the power of said monitor light.

5. A light amplifying device, as set forth in claim 1, wherein said control unit generates a control signal that decreases the power of said control light when the power of said monitor light is smaller than a target value and increases the power of said control light when the power of said monitor light is larger than the target value.

6. A light amplifying device, as set forth in claim 5, wherein said control unit issues a warning signal regarding a power shortage if the power of said monitor light is not increased to the target value even though the power of said control light is decreased to the lower limit.

7. A light amplifying device, as set forth in claim 5, wherein said control unit issues a warning signal regarding a power excess if the power of said monitor is not decreased to the target value even though the power of said control light is increased to the upper limit.

8. A light amplifying device, as set forth in claim 1, wherein the wavelength that gives the maximum gain of said semiconductor optical amplifier is shorter than that of said signal light.

9. A light amplifying device, as set forth in claim 1, wherein the wavelength of said control light almost coincides with the wavelength that gives the maximum gain of said semiconductor optical amplifier.

10. A light amplifying device, as set forth in claim 1, wherein the gain of said semiconductor optical amplifier is polarization independent.

11. A light amplifying device, as set forth in claim 1, wherein said combiner is a WDM coupler.

* * * * *